US011847962B1

(12) United States Patent
Liu et al.

(10) Patent No.: US 11,847,962 B1
(45) Date of Patent: Dec. 19, 2023

(54) ACTIVE MINI LED DISPLAY AND DRIVING METHOD THEREOF

(71) Applicants: Tai-Hui Liu, Taipei (TW); Chung-Hsi Liu, Taipei (TW)

(72) Inventors: Tai-Hui Liu, Taipei (TW); Iwasaki Osasmu, Amagasaki (JP)

(73) Assignees: Tai-Hui Liu, Taipei (TW); Chung-Hsi Liu, Taipei (TW)

( * ) Notice: Subject to any disclaimer, the term of this patent is extended or adjusted under 35 U.S.C. 154(b) by 0 days.

(21) Appl. No.: 18/108,018

(22) Filed: Feb. 10, 2023

(30) Foreign Application Priority Data

Sep. 30, 2022 (TW) .................................. 111137433

(51) Int. Cl.
  *G09G 3/32* (2016.01)
  *G09G 3/20* (2006.01)
  *H01L 25/16* (2023.01)

(52) U.S. Cl.
  CPC ............ *G09G 3/32* (2013.01); *G09G 3/2096* (2013.01); *H01L 25/167* (2013.01); *G09G 2300/0408* (2013.01); *G09G 2300/0452* (2013.01); *G09G 2300/0819* (2013.01); *G09G 2310/0281* (2013.01); *G09G 2360/16* (2013.01)

(58) Field of Classification Search
  CPC .................. G09G 3/32; G09G 3/2096; G09G 2300/0408; G09G 2300/0819; G09G 2310/0281; G09G 2360/16; H01L 25/167
  See application file for complete search history.

(56) References Cited

U.S. PATENT DOCUMENTS

| 11,657,755 B1* | 5/2023 | Pai ........................... G09G 3/32 345/694 |
| 2021/0193034 A1* | 6/2021 | Li .......................... G09G 3/3233 |
| 2021/0210471 A1* | 7/2021 | Lee ........................ H01L 33/58 |
| 2021/0280567 A1* | 9/2021 | Lin ........................ H01L 24/08 |
| 2022/0005414 A1* | 1/2022 | Liu ....................... G09G 3/3266 |

\* cited by examiner

*Primary Examiner* — Kenneth B Lee, Jr.
(74) *Attorney, Agent, or Firm* — Leong C. Lei

(57) ABSTRACT

The present invention provides an active mini LED display and driving method thereof. The driving method comprises: controlling a gate voltage of the metal oxide field effect transistor by a voltage to modulate the current and luminous brightness required to driver the light emitting diode; processing display data to generate timing-controlled channel signals and scanning signals to driver transistors and light emitting diodes to achieve image display; modulating scanning voltage signals or channel voltage signals into analog-type voltages and/or pulse-width-type voltages, and then compensating the unevenness in brightness produced by the epitaxy of each light-emitting diode. The driving method of the active mini LED display of the present invention can reduce the power loss of transmission, and can integrate with various light emitting diodes within a small pixel pitch to manufacture various displays by means of heterogeneous polycrystalline wafer-level packaging.

9 Claims, 18 Drawing Sheets

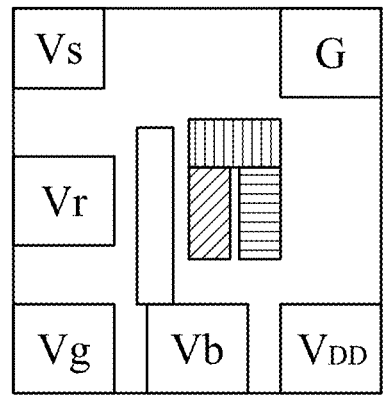
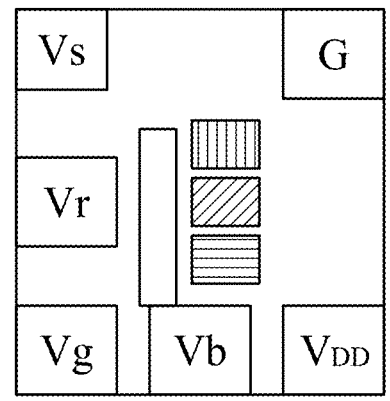
FIG. 3A                    FIG. 3B
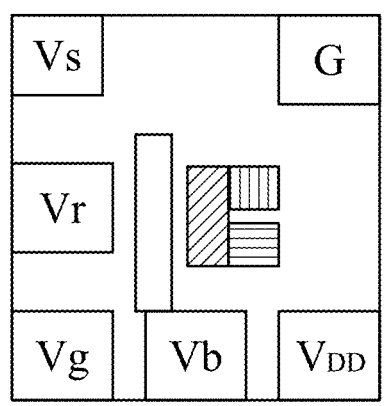
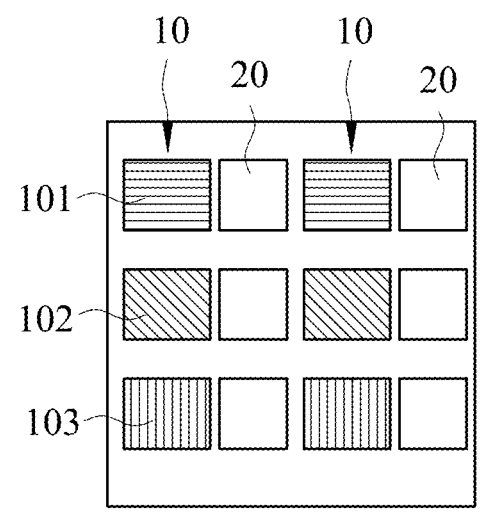
FIG. 3C                    FIG. 3D

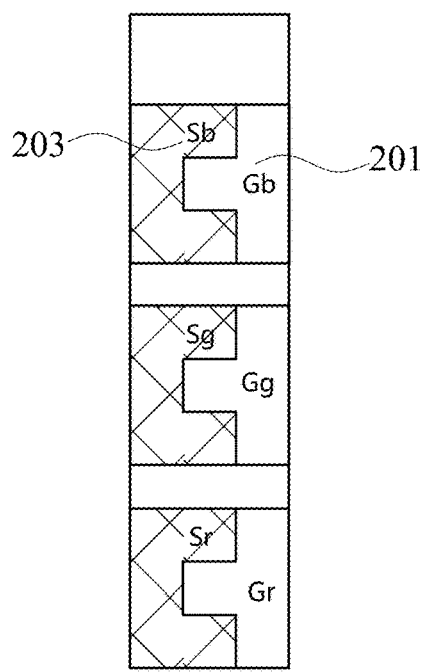
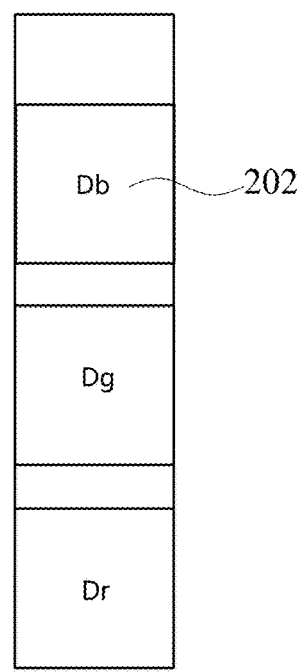
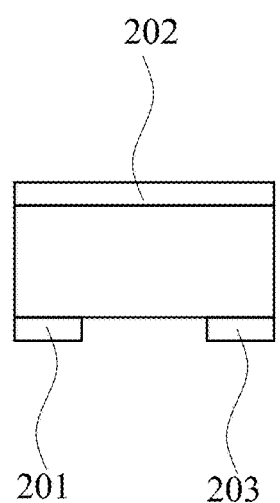
FIG. 14A  FIG. 14B  FIG. 14C
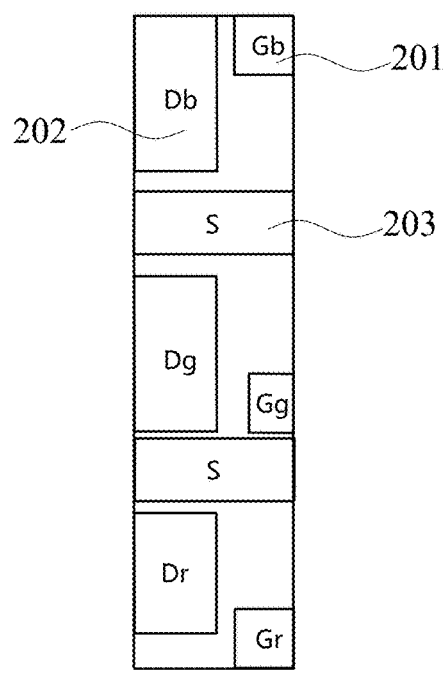
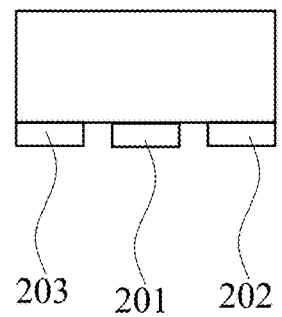
FIG. 14D  FIG. 14E

ACTIVE MINI LED DISPLAY AND DRIVING METHOD THEREOF

(a) TECHNICAL FIELD OF THE INVENTION

The present invention relates to an active mini LED display and a driving method thereof, and more particularly to an active mini LED display and a driving method thereof in which multiple transistor circuits are connected in each pixel, which is different from the traditional way of common cathode or common anode.

(b) DESCRIPTION OF THE PRIOR ART

In recent years, more and more light emitting diodes are used as current mode light emitting devices in high performance displays; compared with liquid crystal screens, an active matrix organic light emitting diodes (AMOLED for short) has the advantages of high contrast, ultra-thin, bendable, etc. due to the self-luminous characteristics of organic light emitting diodes. However, at present, there are two main problems of high uniformity and image sticking, and compensation technology must be considered in order to solve these two problems.

First, compared with amorphous silicon thin film transistors, low temperature polysilicon thin film transistors (Low Temperature Poly-silicon; LIPS for short) and oxide thin-film transistors (Oxide TFT for short) have higher mobility and stability, more suitable for AMOLED display. The low temperature polysilicon thin film transistors are mostly used in small and medium sized applications, and oxide thin film transistors are mostly used in large-scale applications. The low-temperature poly silicon thin-film transistors made on large-area glass substrates have non-uniformity in electrical parameters such as threshold voltage and mobility at different positions. The non-uniformity will be converted into the current difference and brightness difference of the OLED display device and be perceived by the human eye, which is the "mura" (unevenness) phenomenon. Although the uniformity of the oxide thin film transistor is good, its threshold voltage will drift under long-term pressure and high temperature. Due to the different display screens, the threshold drift of the thin film transistor in each part of the panel is different, which will cause display brightness difference. Since this difference is related to the previously displayed image, it often appears as an image sticking phenomenon, which is commonly referred to as image sticking.

Therefore, in the current display manufacture technologies, whether it is the low-temperature polysilicon thin film transistor or the oxide thin film transistor, there are problems of uniformity or stability, and the organic light emitting diode itself will gradually decay in brightness as the lighting time increases. Since these problems are difficult to overcome in the prior art, various compensation techniques need to be used in the design to solve these problems. In addition, tiny light emitting diodes are transferred to the display through the mini LED technology, which has the advantages of low power consumption, long life and high brightness. However, during epitaxy manufacturing, light emitting diodes will produce contour patterns with different degrees of luminous brightness and wavelength on the wafer. In order to avoid transferring the contour pattern to the display, it is necessary to select the LED dies with similar brightness and then mix them to evenly ease the mura on the display to improve the image quality. To sum up, there is an urgent need for a suitable compensation technology to improve the problem of uniformity and image sticking, and effectively improve the problem of luminance degradation of the organic light emitting diodes.

SUMMARY OF THE INVENTION

In view of the shortcomings of the above-mentioned mini LED displays, the main purpose of the present invention is to provide an active mini LED display and a driving method thereof. The gate voltage of the metal oxide field effect transistor connected in series in each pixel can be controlled by using the voltage to modulate the current and luminescent brightness required to drive the light emitting diode. Furthermore, the active mini LED display of the present invention is that a part of the control transistors disposed into each pixel, the driving signal is driven by voltage from the driver chip so the distance between the power supply and the grounding line can be minimized. Moreover, the driver circuit for the channel signal and the driver chip for the scanning signal can be separately arranged on the edge of the display, thereby improving the heat dissipation effect, reducing the complexity of wiring, and improving the quality and reliability of the display.

To achieve the above objective, the present invention provides a driving method for an active mini LED display comprising:

disposing array pixels and a plurality of first metal oxide semiconductor transistors on a substrate, and each pixel having at least one red mini light emitting diode chip, at least one green mini light emitting diode chip, and at least one blue mini light emitting diode chip, and disposing the pixels at equal intervals; wherein at least one red mini light emitting diode chip, at least one green mini light emitting diode chip and at least one blue mini light emitting diode chip are respectively disposed correspondingly to one of the first metal oxide semiconductor transistors;

connecting a gate of the first metal oxide semiconductor transistors to a channel driving signal;

connecting one end of each pixel to a scanning driving signal through a connection line; connecting anther end of each pixel to the sources of the first metal oxide semiconductor transistors; and connecting the scanning driving signal to light up at least one red mini light emitting diode chip, at least one green mini light emitting diode chip and at least one blue mini light emitting diode chip of each pixel and control brightness; and applying a set voltage through the channel driving signal to control the currents passing through at least one red mini light emitting diode chip, at least one green mini light emitting diode chip and at least one blue mini light emitting diode chip respectively to adjust brightness thereof;

wherein the scanning driving signal uses a width signal of a pulse width modulated after modulation to display the brightness of each pixel, and controls to turn on and turn off each pixel in the horizontal direction at the same time.

The present invention also provides an active mini LED display used for the above-mentioned driving method. The active mini LED display is connected to a scanning driving signal and a channel driving signal. The active mini LED display includes a plurality of package modules arranged in an array, and every package module comprises a substrate, a plurality of pixels, a plurality of first metal oxide semiconductor transistors and a plurality of connection lines. First, the plurality of pixels is disposed on the substrate, and each pixel has at least one red mini light emitting diode chip, at least one green mini light emitting diode chip, and at least one blue mini light emitting diode chip, and the pixels are disposed at equal intervals. Moreover, at least one red mini light emitting diode chip, at least one green mini light emitting diode chip and at least one blue mini light emitting diode chip are respectively provided with one of the first metal oxide semiconductor transistors, and the first metal oxide semiconductor transistors respectively have a source connected to the scanning driving signal, a gate connected to the channel driving signal and a drain. In addition, one end of each pixel is connected together by each connection line and connected to the scanning driving signal through a second metal oxide semiconductor transistor.

In some embodiments, the red mini light emitting diode chip, the green mini light emitting diode chip and the blue mini light emitting diode diode chip are controlled by the set voltage applied the channel driving signal to adjust the brightness respectively. Further, the scanning driving signal connects the red mini light emitting diode chip, the green mini light emitting diode chip and the blue mini light emitting diode chip in each pixel to control the brightness respectively. Moreover, the method of the present invention is a heterogeneous polycrystalline wafer level packaging method, and various displays can be manufactured and designed.

BRIEF DESCRIPTION OF THE DRAWINGS

The above and other objectives, features and other advantages of the present invention will be more clearly understood from the following detailed description taken in conjunction with the accompanying drawings, in which:

FIG. 3A is schematic diagram of arrangement type 1 of light emitting diode chips in a pixel of the present invention;

FIG. 3B is schematic diagram of arrangement type 2 of light emitting diode chips in a pixel of the present invention;

FIG. 3C is schematic diagram of arrangement type 3 of light emitting diode chips in a pixel of the present invention;

FIG. 3D is schematic diagram of arrangement type 4 of light emitting diode chips in a pixel of the present invention;

FIG. 14A is a top view of the vertical structure of the metal oxide semiconductor transistor of the present invention;

FIG. 14B is a bottom view of the vertical structure of the metal oxide semiconductor transistor of the present invention;

FIG. 14C is a cross-section view of the vertical structure of the metal oxide semiconductor transistor of the present invention;

FIG. 14D is a top view of horizontal structure of the metal oxide semiconductor transistor of the present invention;

FIG. 14E is a cross-section view of the vertical structure of the metal oxide semiconductor transistor of the present invention;

DETAILED DESCRIPTION OF THE PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
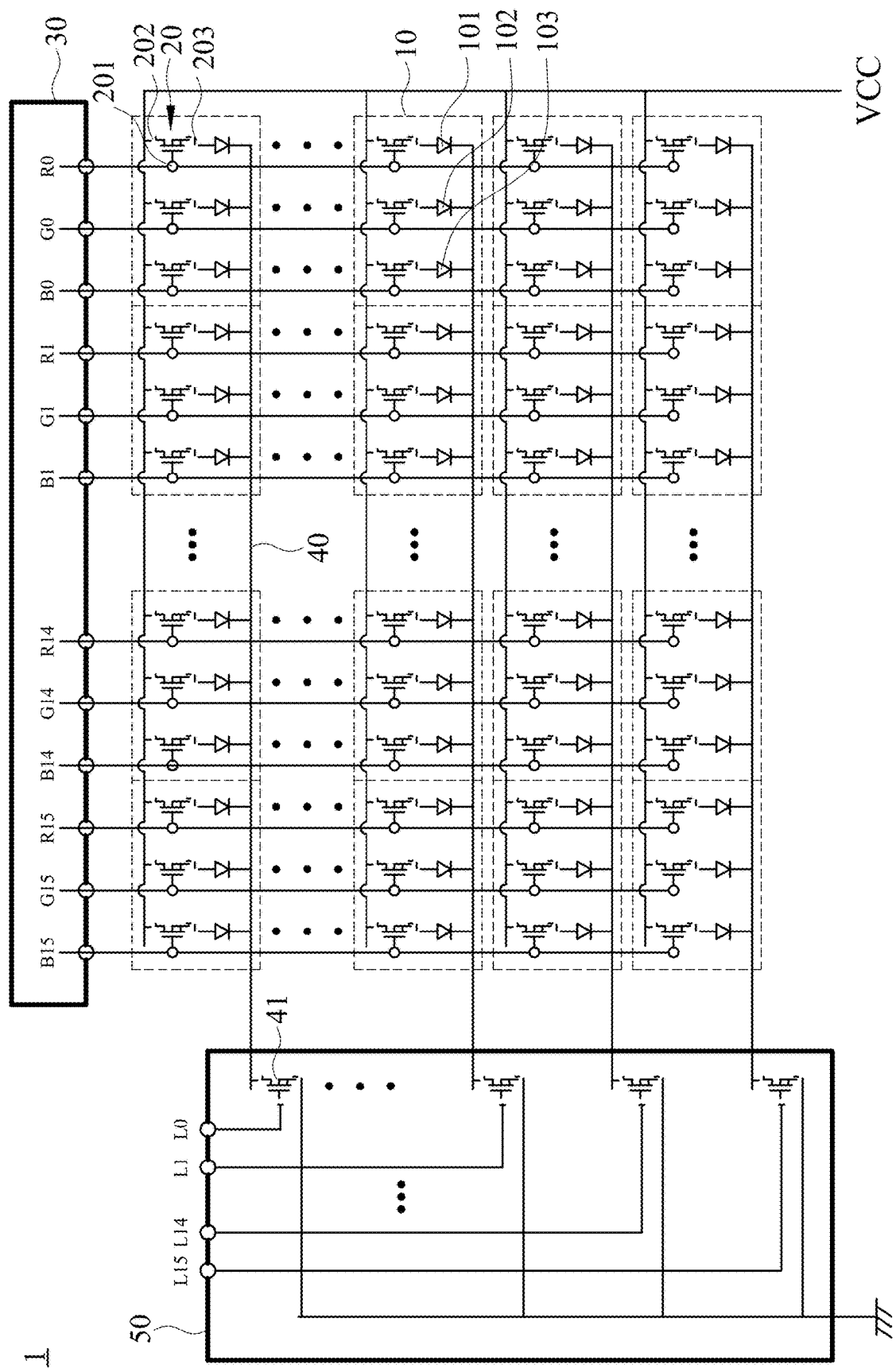
FIG. 1 is a circuit diagram of an active mini LED display according to Embodiment 1 of the present invention.
Figures 2A, 2B:
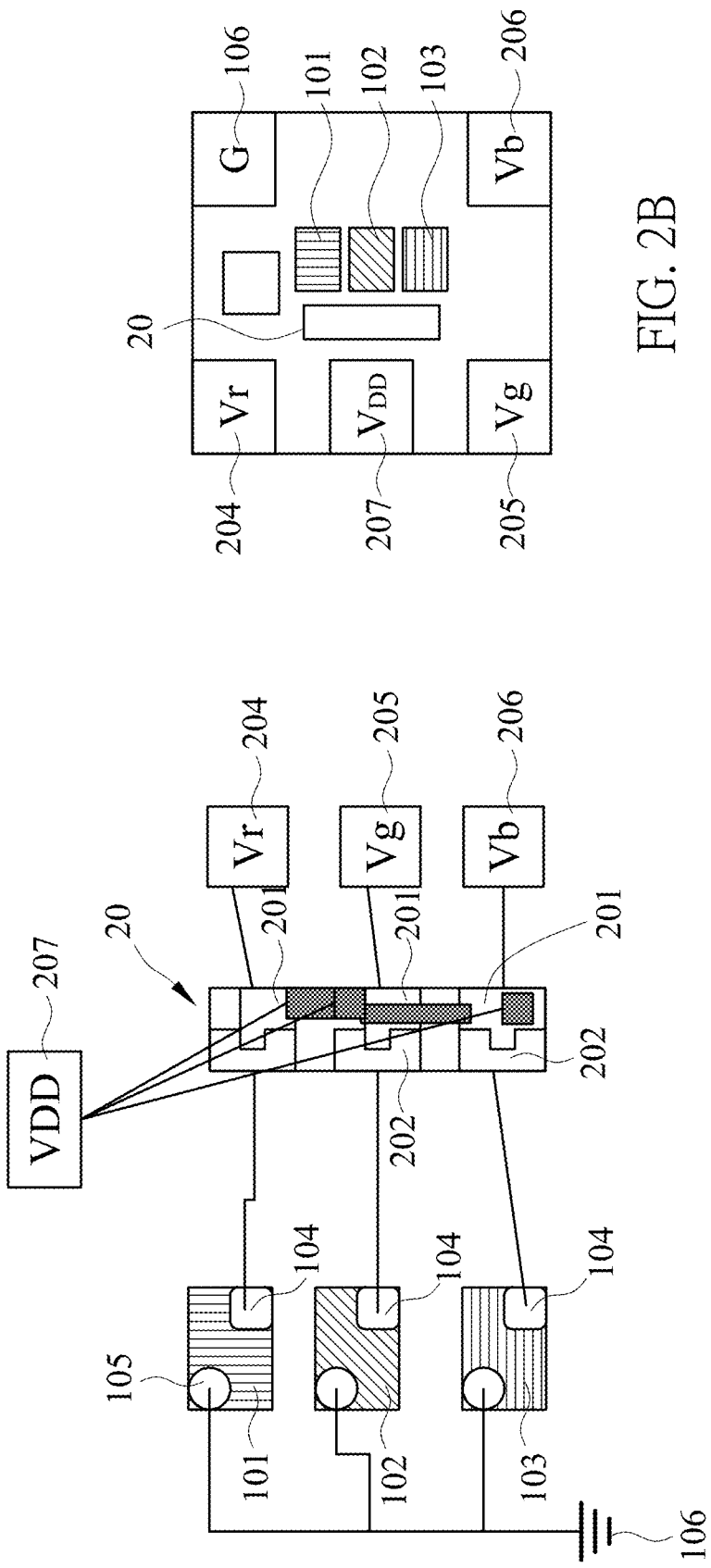
FIG. 2A is a schematic diagram of back arrangement of pixel of the active mini LED display according to Embodiment 1 of the present invention.
FIG. 2B is a schematic diagram of light emitting surface of pixel of the active mini LED display according to Embodiment 1 of the present invention.

The following detailed description of the present application is taken in conjunction with the accompanying drawings, in which:

Please refer to FIG. 1 to FIG. 2B, FIG. 1 is a circuit diagram of an active mini LED display according to Embodiment 1 of the present invention; FIG. 2A is a schematic diagram of back arrangement of pixel of the active mini LED display according to Embodiment 1 of the present invention; and FIG. 2B is a schematic diagram of light emitting surface of the pixel of the active mini LED display according to Embodiment 1 of the present invention.

As shown in FIG. 1 to FIG. 2B, the present invention provides a driving method for an active mini LED display comprising:

disposing array pixels 10 and a plurality of first metal oxide semiconductor transistors 20 on a substrate, and each pixel 10 having at least one red mini light emitting diode chip 101, at least one green mini light emitting diode chip 102, and at least one blue mini light emitting diode chip 103, and disposing the pixels at equal intervals; wherein at least one red mini light emitting diode chip 101, at least one green mini light emitting diode chip 102 and at least one blue mini light emitting diode chip 103 are respectively disposed correspondingly to one of the first metal oxide semiconductor transistors 20;

connecting a gate 201 of the first metal oxide semiconductor transistors 20 to a channel driving signal 30;

connecting one end of each pixel 10 together through a connection line 40 and connecting to a scanning driving signal 50 through a second metal oxide semiconductor transistor 41; connecting anther end of each pixel 10 to the sources 203 of the first metal oxide semiconductor transistors 20; and connecting the scanning driving signal 50 to light up at least one red mini light emitting diode chip 101, at least one green mini light emitting diode chip 102 and at least one blue mini light emitting diode chip 103 of each pixel 10 and controlling brightness; and applying a set voltage through the channel driving signal 30 to control the currents passing through at least one red mini light emitting diode chip 101, at least one green mini light emitting diode chip 102 and at least one blue mini light emitting diode chip 103 respectively to adjust brightness thereof;

wherein the scanning driving signal 50 uses a width signal of a pulse width modulated after modulation to display the brightness of each pixel 10, and controls to turn on and turn off each pixel 10 in the horizontal direction at the same time.

As shown in FIG. 2A, the first metal oxide semiconductor transistors 20 are a p-type metal oxide semiconductor field effect transistor; and the red mini light emitting diode chip 101, the green mini light emitting diode chip 102 and the blue mini light emitting diode 103 respectively correspond to one of the first metal oxide semiconductor transistors 20; wherein the electrodes of the red mini light emitting diode chip 101, the green mini light emitting diode chip 102 and the blue mini light emitting diode chip 103 are all in a horizontal structure. The drains 202 of the first metal oxide semiconductor transistors 20 are respectively connected to the anodes of the red mini light emitting diode chip 101, the green mini light emitting diode chip 102 and the blue mini light emitting diode chip 103. The cathodes of the red mini light emitting diode chip 101, the green mini light emitting diode chip 102 and the blue mini light emitting diode chip 103 are commonly connected to a ground terminal 106. Each gate 201 of the first metal oxide semiconductor transistors 20 is respectively connected to a Vr pin 204, a Vg pin 205 and a Vb pin 206, and a drain pin 207 is connected to the source 203 of the first metal oxide semiconductor transistor 20.

Please refer to FIG. 3A to FIG. 3D, FIG. 3A is schematic diagram of arrangement type 1 of light emitting diode chips in a pixel of the present invention; FIG. 3B is schematic diagram of arrangement type 2 of light emitting diode chips in a pixel of the present invention; FIG. 3C is schematic diagram of arrangement type 3 of light emitting diode chips in a pixel of the present invention; and FIG. 3D is schematic diagram of arrangement type 4 of light emitting diode chips in a pixel of the present invention.

As shown in FIG. 3A to FIG. 3C, the electrodes of the red mini light emitting diode chip 101, the green mini light emitting diode chip 102 and the blue mini light emitting diode chip 103 in each pixel 10 can be a horizontal structure or a vertical structure. As shown in FIG. 3D, each pixel 10 includes two red mini light emitting diode chips 101, two green mini light emitting diode chips 102 and two blue mini light emitting diode chips 103.

Figure 4:
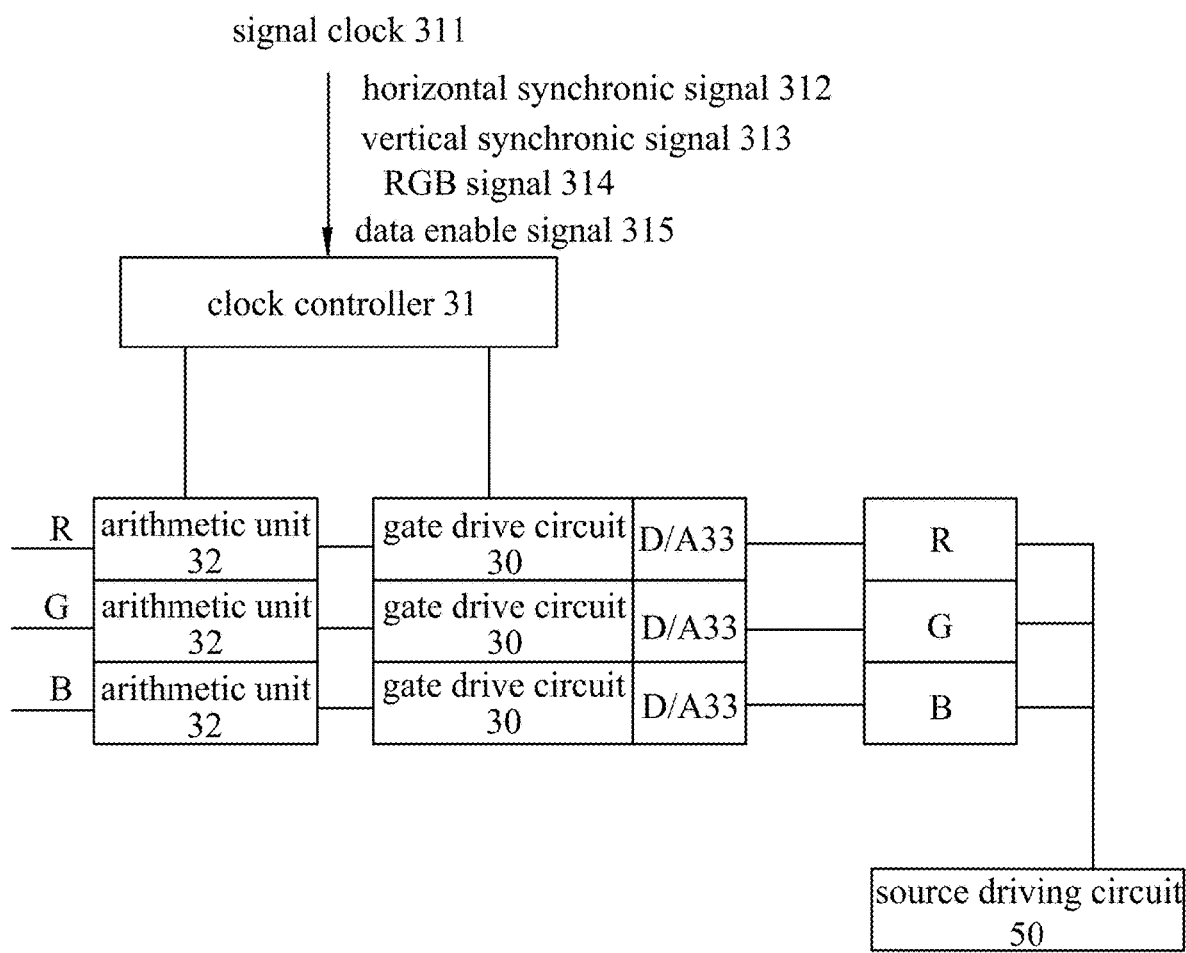
FIG. 4 is a schematic diagram of the optical compensation method of Embodiment 1 of the present invention.

Please refer to FIG. 4, FIG. 4 is a schematic diagram of the optical compensation method of Embodiment 1 of the present invention.

As shown in FIG. 4, a driving method of the active mini LED display further includes a clock signal 311, a horizontal synchronic signal 312, a vertical synchronic signal 313, and an RGB signal 314 obtained from an image signal and a data enable signal 315 for generating module image display controlled sequentially to turn on and turn off the channel driving signal 30 and the scanning driving signal 50 through a clock controller 31. Furthermore, a forward voltage drop information of each pixel 10 is corrected by an arithmetic unit 32 to calculate a correction value of the voltage offset, and the difference in color or brightness of each pixel 10 is corrected according to the correction value, and the forward voltage drop information and the information of the difference of color or brightness of each pixel are stored in a flash read-only memory; wherein the arithmetic unit 32 is composed of the flash read-only memory, an adder and a multiplier. Moreover, the signal corresponding to the channel driving signal 30 is calculated through a digital-to-analog converter 33, the chromatic aberration of each pixel 10 is compensated and corrected by the voltages of the first metal oxide semiconductor transistors 20 connected to the red mini light emitting diode chip 101, the green mini light emitting diode chip 102 and the blue mini light emitting diode chip 103.

Figure 5:
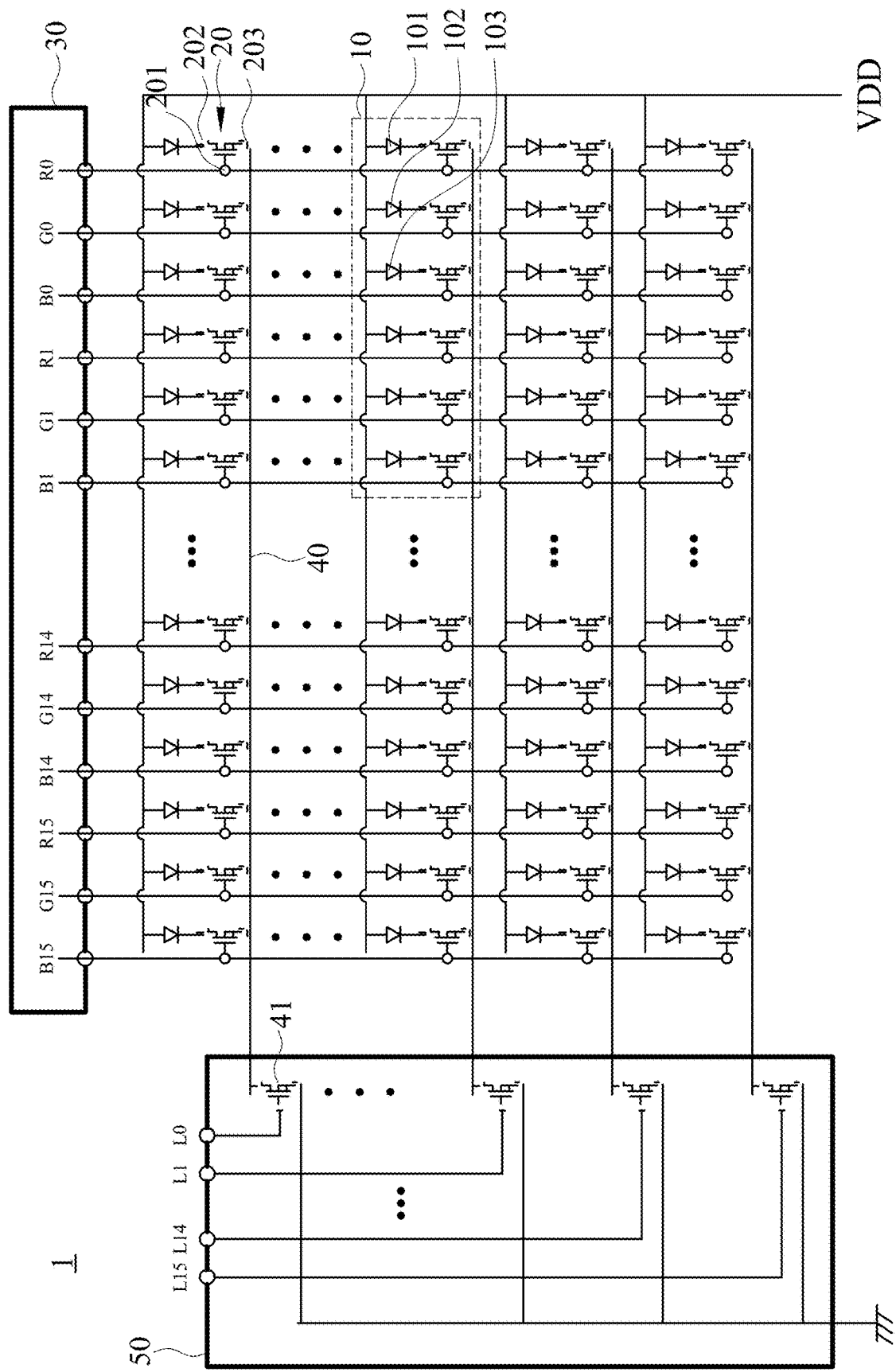
FIG. 5 is a circuit diagram of the active mini LED display according to Embodiment 2 of the present invention.
Figure 6B:
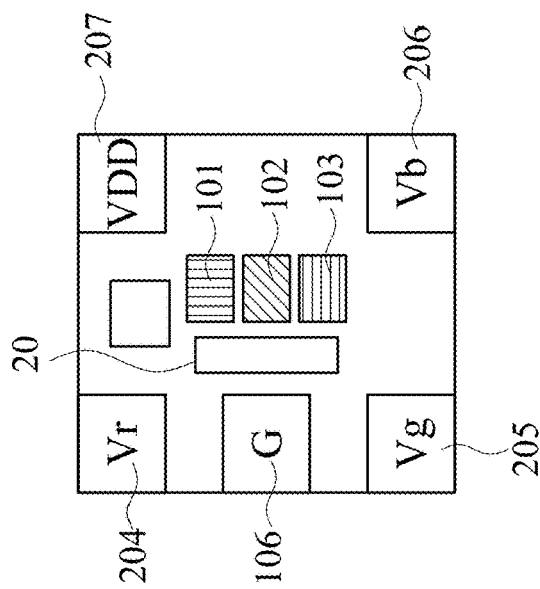
FIG. 6B is a schematic diagram of light emitting surface of pixel of the active mini LED display according to Embodiment 2 of the present invention.
Figure 6A:
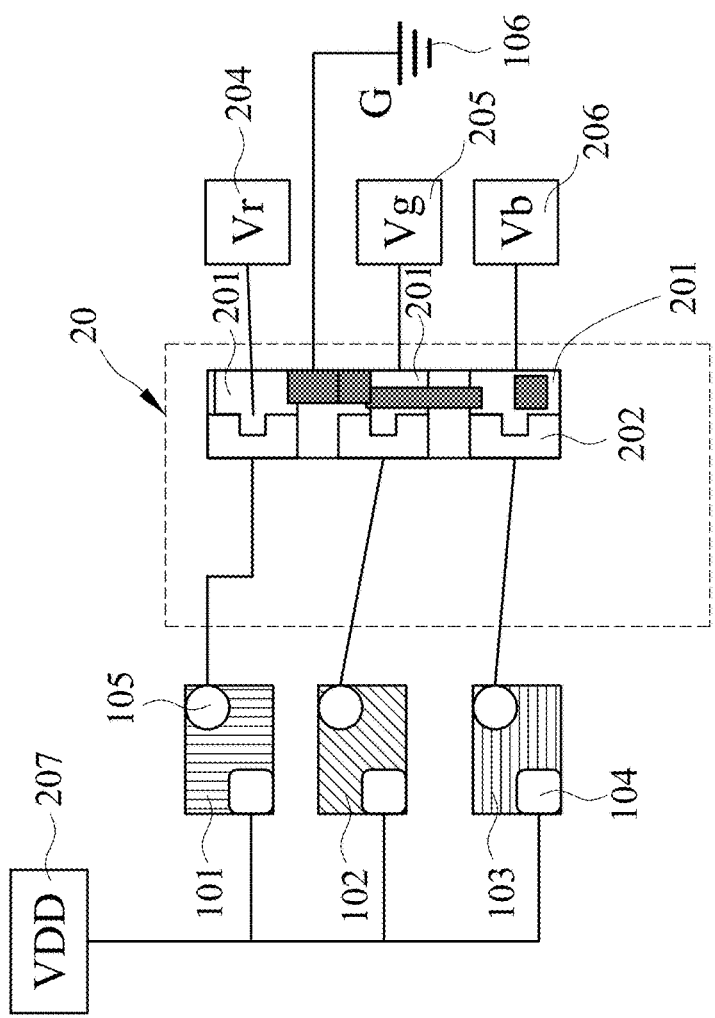
FIG. 6A is a schematic diagram of back arrangement of pixel of the active mini LED display according to Embodiment 2 of the present invention.

Please refer to FIG. 5 to FIG. 6B, FIG. 5 is a circuit diagram of the active mini LED display according to Embodiment 2 of the present invention; FIG. 6A is a schematic diagram of back arrangement of pixel of the active mini LED display according to Embodiment 2 of the present invention; and FIG. 6B is a schematic diagram of light emitting surface of pixel of the active mini LED display according to Embodiment 2 of the present invention.

As shown in FIG. 5 to FIG. 6B, the active mini LED display in the Embodiment 2 of the present invention is substantially the same as in the Embodiment 1, except that the first metal oxide semiconductor transistors 20 in Embodiment 1 are disposed behind each pixel 10, the first metal oxide semiconductor transistors 20 of Embodiment 2 are disposed in front of each pixel 10, and the first metal oxide semiconductor transistors 20 are N-type metal oxide half field effect transistors. Furthermore, the drains 202 of the first metal oxide semiconductor transistors 20 are connected to the cathode 105 of the red mini light emitting diode chip 101, the cathode 105 of the green mini light emitting diode chip 102, and the blue mini light emitting diode chip 103 respectively. The anode 104 of the red mini light emitting diode chip 101, the anode 104 of the green mini light emitting diode chip 102 and the anode 104 of the blue mini light emitting diode chip 103 are connected together to the drain pin 207. The sources 203 of the first metal oxide semiconductor transistors 20 are connected to a ground terminal 106.

Figure 7:
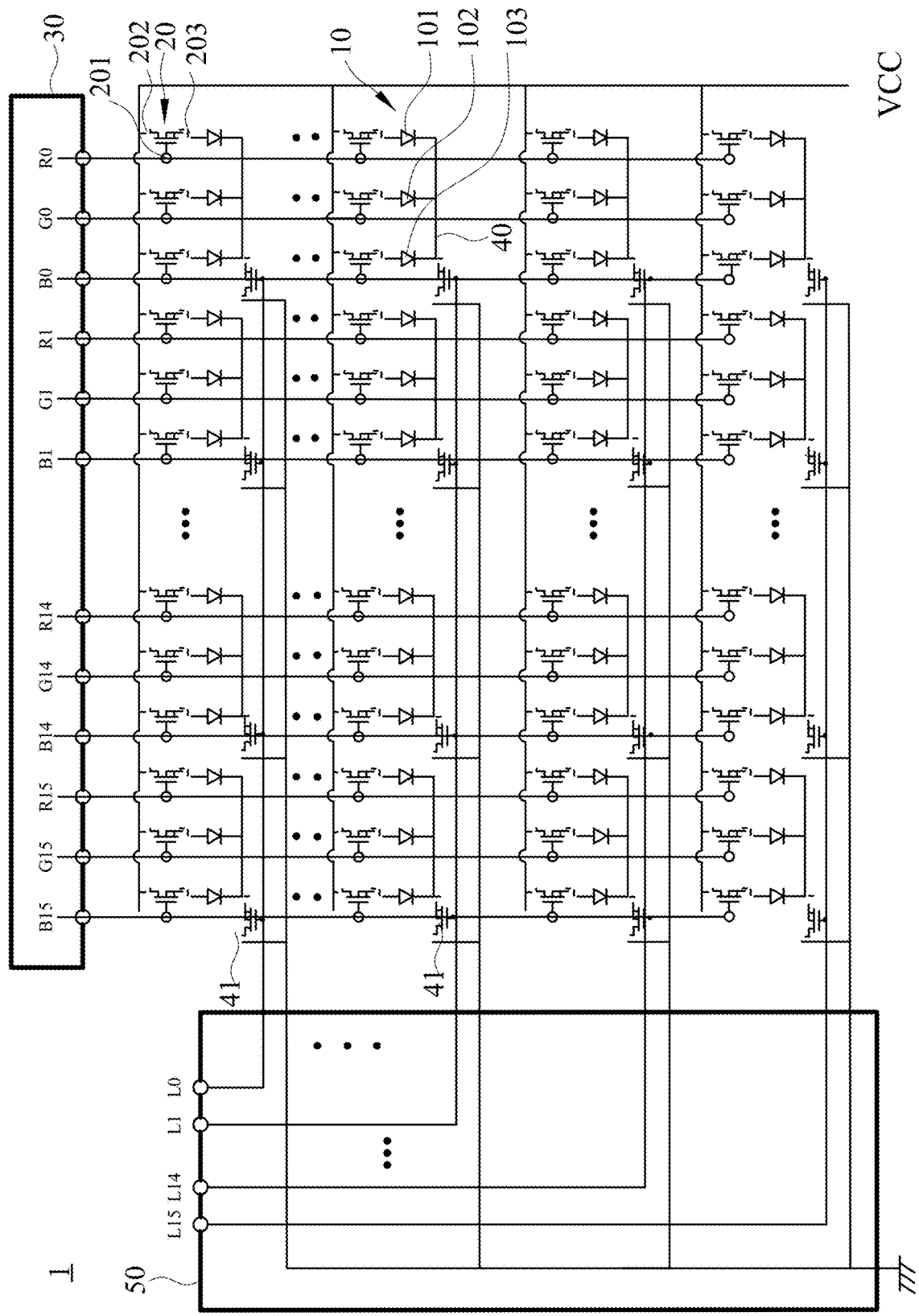
FIG. 7 is a circuit diagram of the active mini LED display according to Embodiment 3 of the present invention.
Figure 8B:
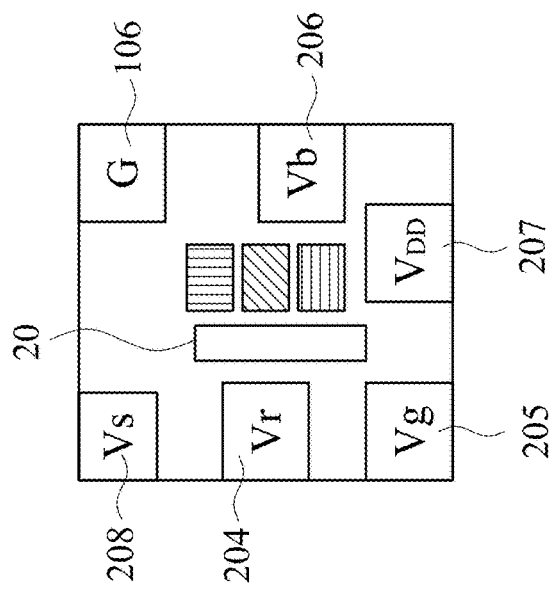
FIG. 8B is a schematic diagram of light emitting surface of pixel of the active mini LED display according to Embodiment 3 of the present invention.
Figure 8A:
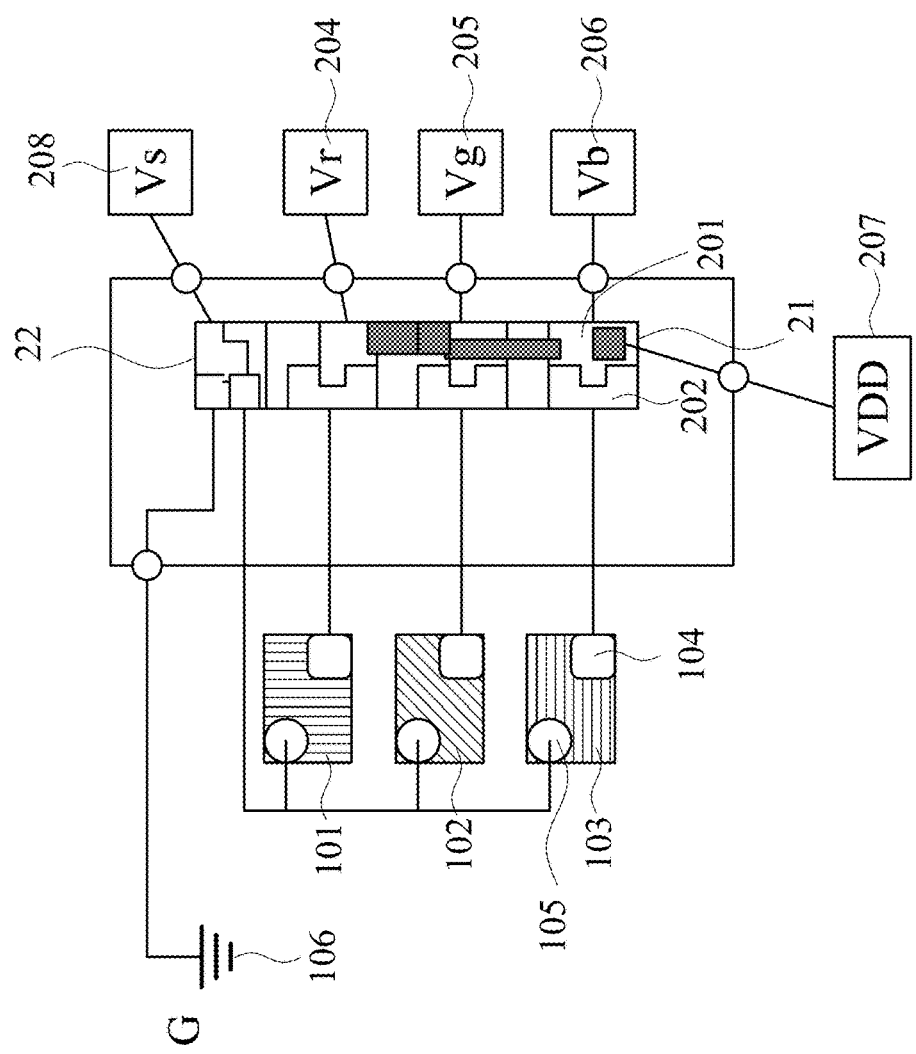
FIG. 8A is a schematic diagram of back arrangement of pixel of the active mini LED display according to Embodiment 3 of the present invention.

Please refer to FIG. 7 to FIG. 8B, FIG. 7 is a circuit diagram of the active mini LED display according to Embodiment 3 of the present invention; FIG. 8A is a schematic diagram of back arrangement of pixel of the active mini LED display according to Embodiment 3 of the present invention; and FIG. 8B is a schematic diagram of light emitting surface of pixel of the active mini LED display according to Embodiment 3 of the present invention.

As shown in FIG. 7 to FIG. 8B, the active mini LED display in the Embodiment 3 of the present invention is substantially the same as in the Embodiment 1, except that the second metal oxide semiconductor transistor 41 of Embodiment 1 is disposed on the scanning driving signal 50, and the second metal oxide semiconductor transistor 41 of Embodiment 3 is disposed in the pixels 10, so that the circuit is shorter than Embodiment 1. Furthermore, the cathode of the red mini light emitting diode chip 101, the cathode of the green mini light emitting diode chip 102, and the cathode of the blue mini light emitting diode chip 103 in Embodiment 1 are commonly connected to the ground terminal 106. However, the cathode of the red mini light emitting diode chip 101, the cathode of the green mini light emitting diode chip 102, and the cathode of the blue mini light emitting diode chip 103 in Embodiment 3 are commonly connected to the sources 203 of the first metal oxide semiconductor transistors 20. Furthermore, the drains 202 of the first metal oxide semiconductor transistors 20 are respectively connected to the anodes of the red mini light emitting diode chip 101, the green mini light emitting diode chip 102 and the blue mini light emitting diode chip 103 and the ground terminal 106. In addition, the gates 201 at the front end of the first metal oxide semiconductor transistors 20 are connected to the drain pin 207, and the gates 201 at the back end of the first metal oxide semiconductor transistors 20 are connected to a source voltage 208, the rest of the gates 201 of the first metal oxide semiconductor transistors 20 are respectively connected to the Vr pin 204, the Vg pin 205 and the Vb pin 206.

Figure 9B:
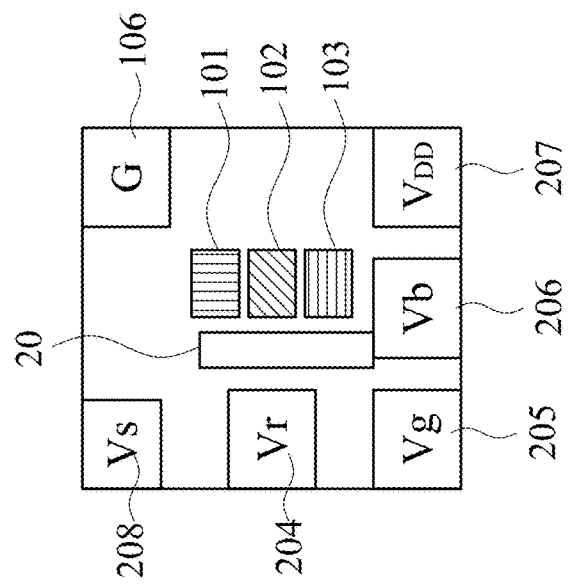
FIG. 9B is a schematic diagram of light emitting surface of pixel of the active mini LED display according to Embodiment 4 of the present invention.
Figure 9A:
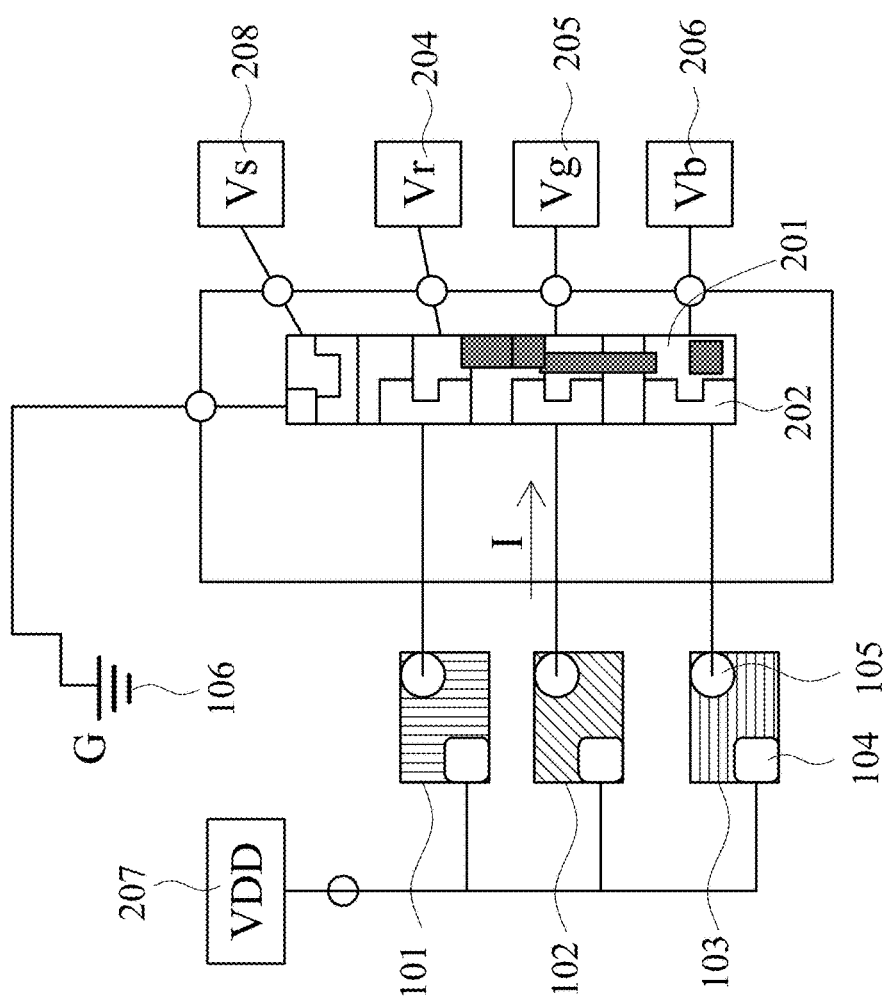
FIG. 9A is a schematic diagram of back arrangement of pixel of the active mini LED display according to Embodiment 4 of the present invention.

Please refer to FIG. 9A to FIG. 9B, FIG. 9A is a schematic diagram of back arrangement of pixel of the active mini LED display according to Embodiment 4 of the present invention; and FIG. 9B is a schematic diagram of light emitting surface of pixel of the active mini LED display according to Embodiment 4 of the present invention.

As shown in FIG. 9A to FIG. 9B, the active mini LED display in the Embodiment 4 of the present invention is substantially the same as in the Embodiment 3, except that the metal oxide semiconductor transistors 20 of Embodiment 3 are disposed behind each pixel 10, and the first metal oxide semiconductor transistors 20 are P-type metal oxide semiconductor field effect transistors. However, the metal oxide semiconductor transistors 20 of Embodiment 4 are disposed in front of each pixel 10, and the first metal oxide semiconductor transistors 20 are N-type metal oxide semiconductor field effect transistors. Furthermore, the anode of the red mini light emitting diode chip 101, the anode of green mini light emitting diode chip 102, and the anode of blue mini light emitting diode chip 103 are commonly connected to the drain pin 207. The cathode of the red mini light emitting diode chip 101, the cathode of green mini light emitting diode chip 102, and the cathode of blue mini light emitting diode chip 103 are commonly connected to the drain pin 207 are commonly connected to the drains 202 of the first metal oxide semiconductor transistors 20. In addition, each gate 201 of the first metal oxide semiconductor transistors 20 is respectively connected to the Vr pin 204, the Vg pin 205, the Vb pin 206 and source voltage 208; and the sources 203 of the first metal oxide semiconductor transistors 20 are connected to the ground terminal 106.

Figure 10B:
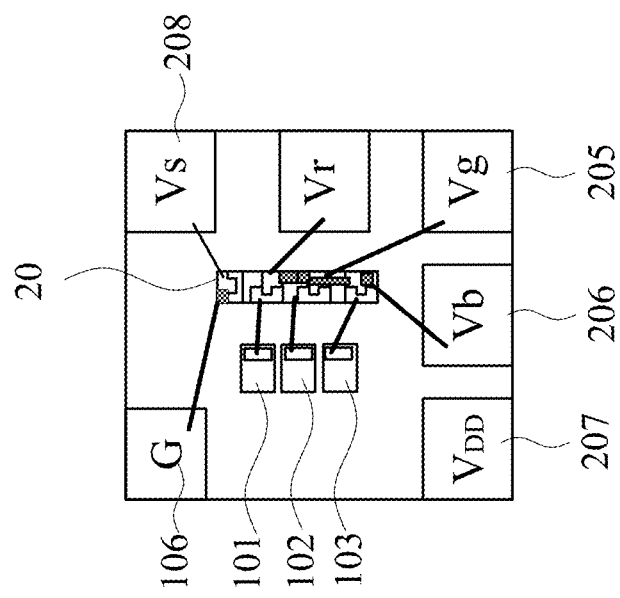
FIG. 10B is a schematic diagram of light emitting surface of pixel of the active mini LED display according to Embodiment 5 of the present invention.
Figure 10A:
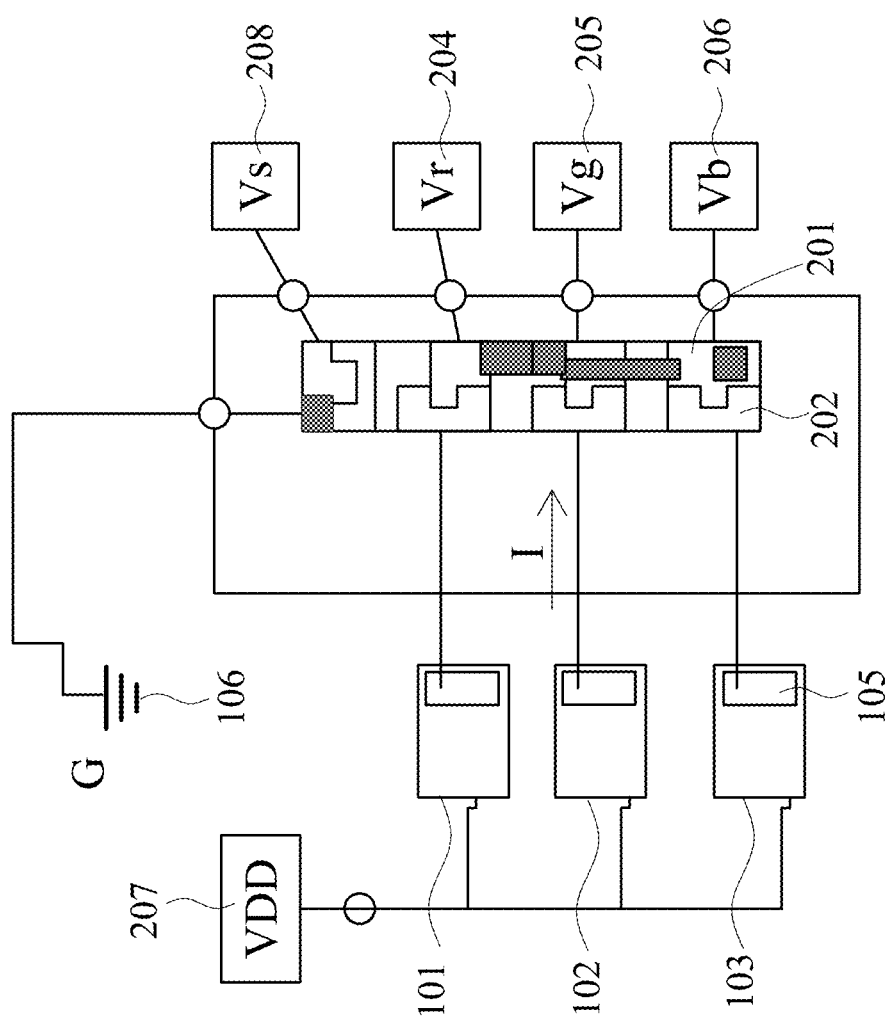
FIG. 10A is a schematic diagram of arrangement of light emitting surface of pixel of the active mini LED display according to Embodiment 5 of the present invention.
Figure 10D:
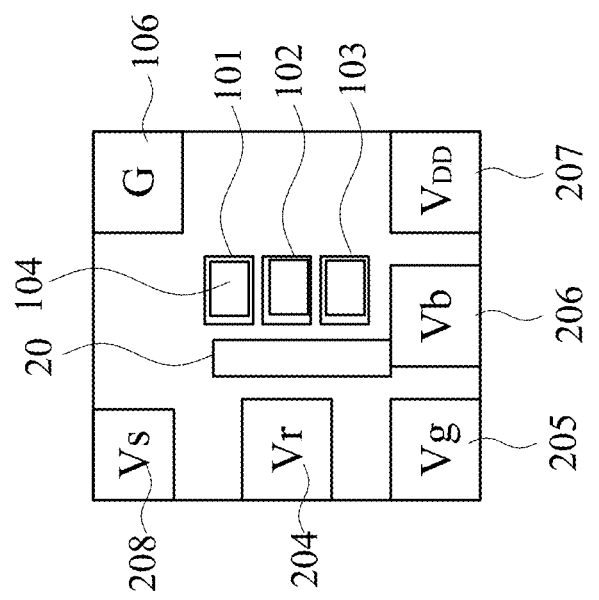
FIG. 10D is a schematic diagram of back configuration of pixel of the active mini LED display according to Embodiment 5 of the present invention.
Figure 10C:
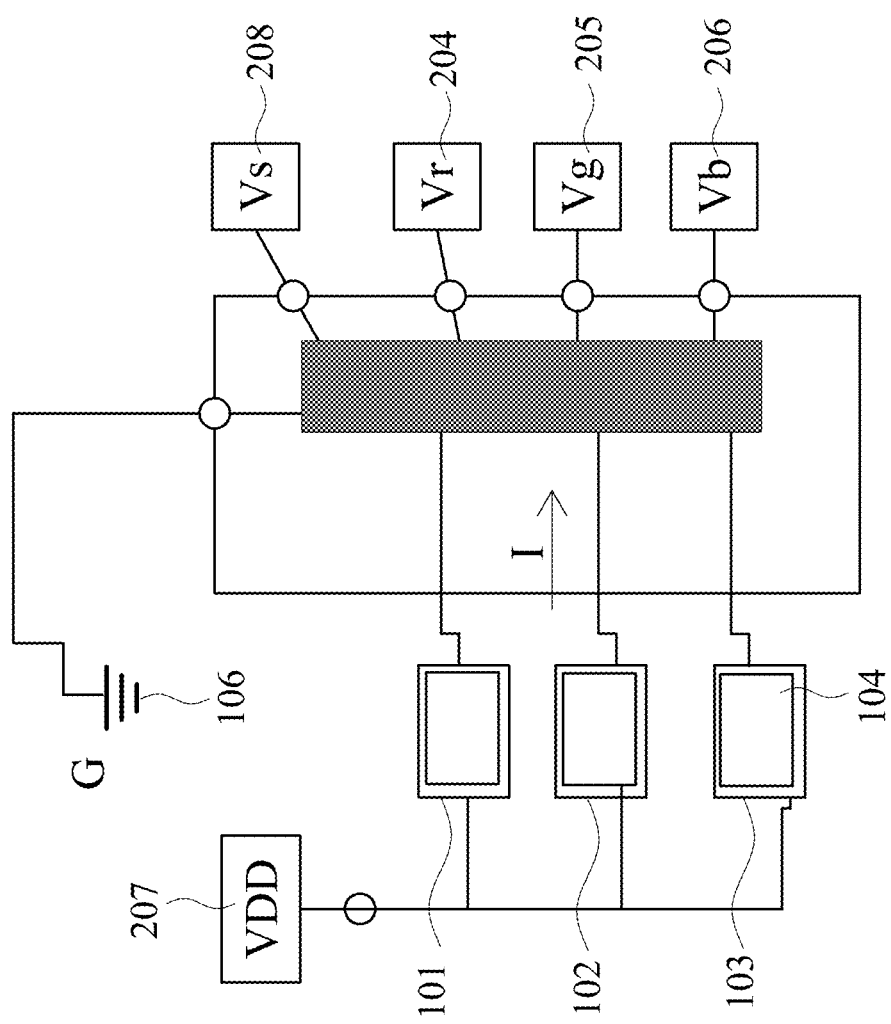
FIG. 10C is a schematic diagram of arrangement of back configuration of pixel of the active mini LED display according to Embodiment 5 of the present invention.

Please refer to FIG. 10A to FIG. 10D, FIG. 10A is a schematic diagram of arrangement of light emitting surface of pixel of the active mini LED display according to Embodiment 5 of the present invention; FIG. 10B is a schematic diagram of light emitting surface of pixel of the active mini LED display according to Embodiment 5 of the present invention; FIG. 10C is a schematic diagram of back arrangement of pixel of the active mini LED display according to Embodiment 5 of the present invention; and FIG. 10D is a schematic diagram of back configuration of pixel of the active mini LED display according to Embodiment 5 of the present invention.

As shown in FIG. 10A to FIG. 10D, the active mini LED display in the Embodiment 5 of the present invention is substantially the same as in the Embodiment 4, except that an electrode of the red mini light emitting diode chip 101, an electrode of green mini light emitting diode chip 102, and an electrode of blue mini light emitting diode chip 103 are all in a horizontal structure. However, the electrode of the red mini light emitting diode chip 101, the electrode of green mini light emitting diode chip 102, and the electrode of blue mini light emitting diode chip 103 are all in a vertical structure. In Embodiment 5, as shown in FIG. 10A to FIG. 10B, the cathode of the red mini light emitting diode chip 101, the cathode of green mini light emitting diode chip 102, and the cathode of blue mini light emitting diode chip 103 are disposed on the light emitting surface and connected to the drain 202 of the first metal oxide semiconductor transistors 20 respectively. Furthermore, the gates 201 of the first metal oxide semiconductor transistors 20 are respectively connected to the Vr pin 204, the Vg pin 205, the Vb pin 206 and the source voltage 208; and the sources 203 of the first metal oxide semiconductor transistors 20 are connected to the ground terminal 106. Moreover, the red mini light emitting diode chip 101, the green mini light emitting diode chip 102, and the blue mini light emitting diode chip 103 are connected to the back side and connected to the drain pin 207. In addition, as shown in FIG. 10C to FIG. 10D, the anode of the red mini light emitting diode chip 101, the anode of green mini light emitting diode chip 102, and the anode of blue mini light emitting diode chip 103 are disposed on the back side, and one end of the pixel 10 is connected to the drain pin 207 and another end is connected to the back side to connect to the first metal oxide semiconductor transistors 20.

Figures 11A, 11B:
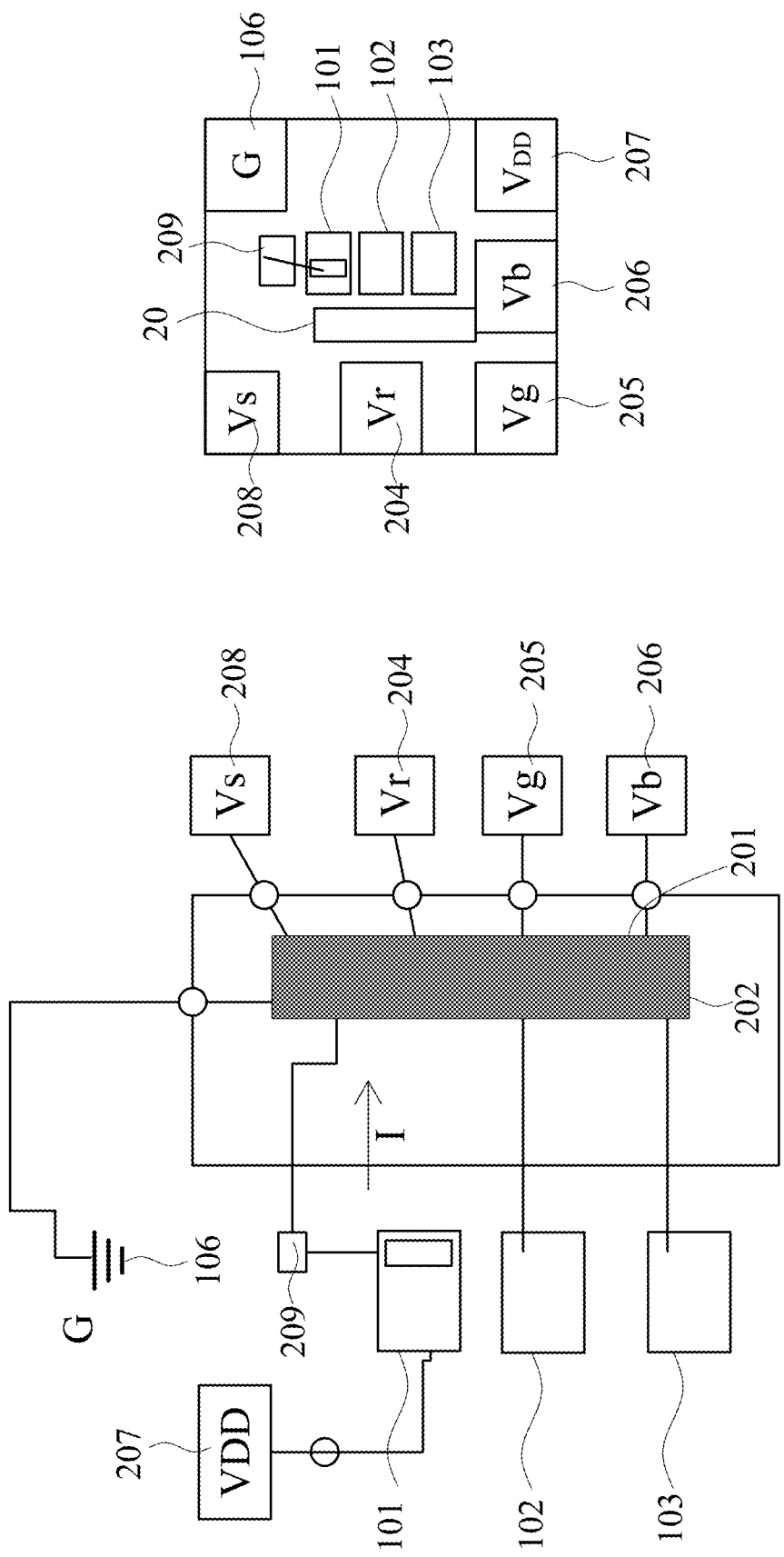
FIG. 11A is a schematic diagram of arrangement of light emitting surface of pixel of the active mini LED display according to Embodiment 6 of the present invention.
FIG. 11B is a schematic diagram of light emitting surface of pixel of the active mini LED display according to Embodiment 6 of the present invention.
Figure 11D:
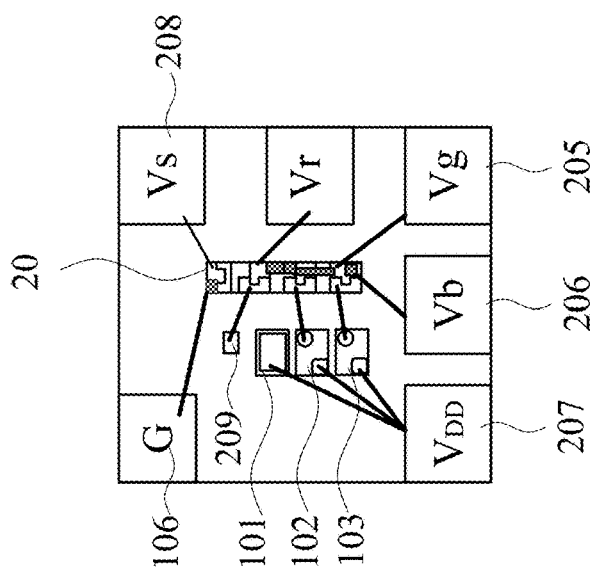
FIG. 11D is a schematic diagram of back of pixel of the active mini LED display according to Embodiment 6 of the present invention.
Figure 11C:
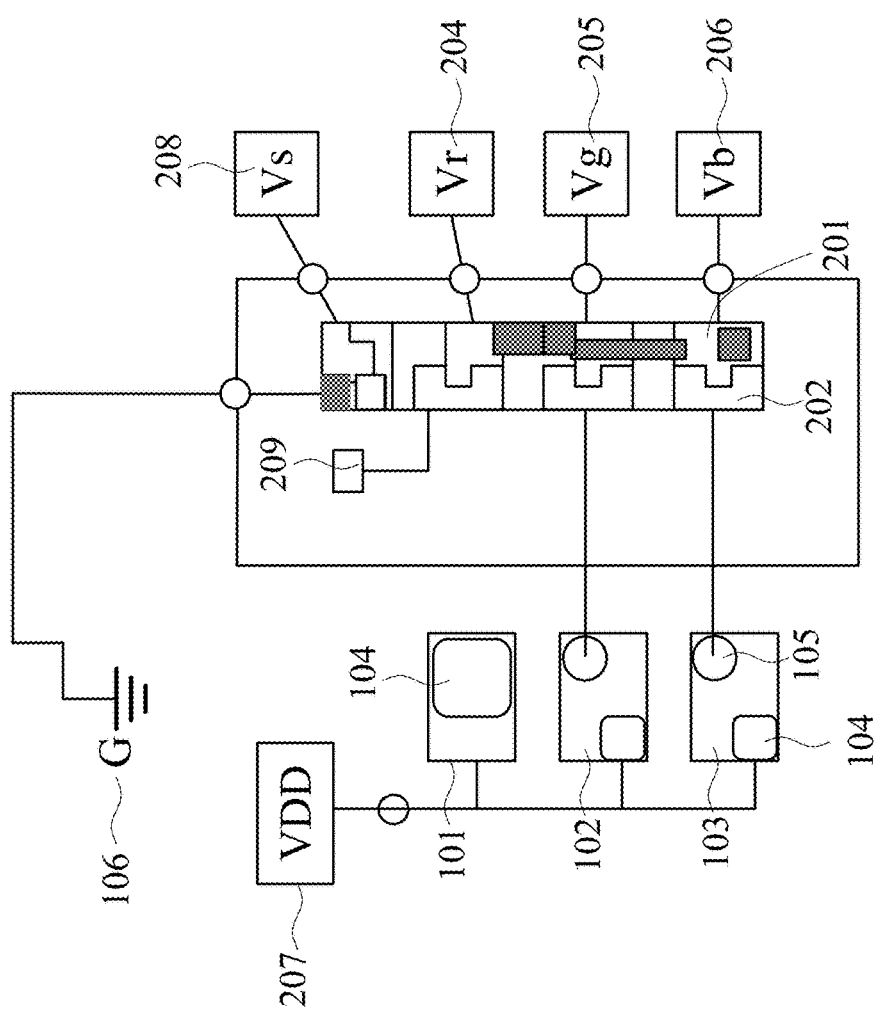
FIG. 11C is a schematic diagram of back arrangement of pixel of the active mini LED display according to Embodiment 6 of the present invention.

Please refer to FIG. 11A to FIG. 11D, FIG. 11A is a schematic diagram of arrangement of light emitting surface of pixel of the active mini LED display according to Embodiment 6 of the present invention; FIG. 11B is a schematic diagram of light emitting surface of pixel of an active mini LED display according to Embodiment 6 of the present invention; FIG. 11C is a schematic diagram of back arrangement of pixel of an active mini LED display according to Embodiment 6 of the present invention; and FIG. 11D is a schematic diagram of back of pixel of an active mini LED display according to Embodiment 6 of the present invention.

As shown in FIG. 11A to FIG. 11D, the active mini LED display in the Embodiment 6 of the present invention is substantially the same as in the Embodiment 5, except that the electrode of the red mini light emitting diode chip 101, the electrode of green mini light emitting diode chip 102, and the electrode of blue mini light emitting diode chip 103 are all in a vertical structure. However, the electrode of the red mini light emitting diode chip 101 is a vertical structure, the electrode of the green mini light emitting diode chip 102 and the electrode of the blue mini light emitting diode chip 103 both in a horizontal structure, a contact 209 connected to the anode of the red mini light emitting diode chip 101 in Embodiment 6. As shown in FIG. 11A to FIG. 11B, the red mini light emitting diode chip 101 is connected to the back side and connected to the drain pin 207. As shown in FIG. 11C to FIG. 11D, the cathode of the green mini light emitting diode chip 102 and the cathode of the blue mini light emitting diode chip 103 are connected to the drains 202 of the first metal oxide semiconductor transistors 20; the source 203 of the first metal oxide semiconductor transistors 20 is connected to the ground terminal 106; and the gate 201 of the first metal oxide semiconductor transistors 20 are respectively connected to the VT pin 204, the Vg pin 205, the Vb pin 206 and the source voltage 208.

Figure 12:
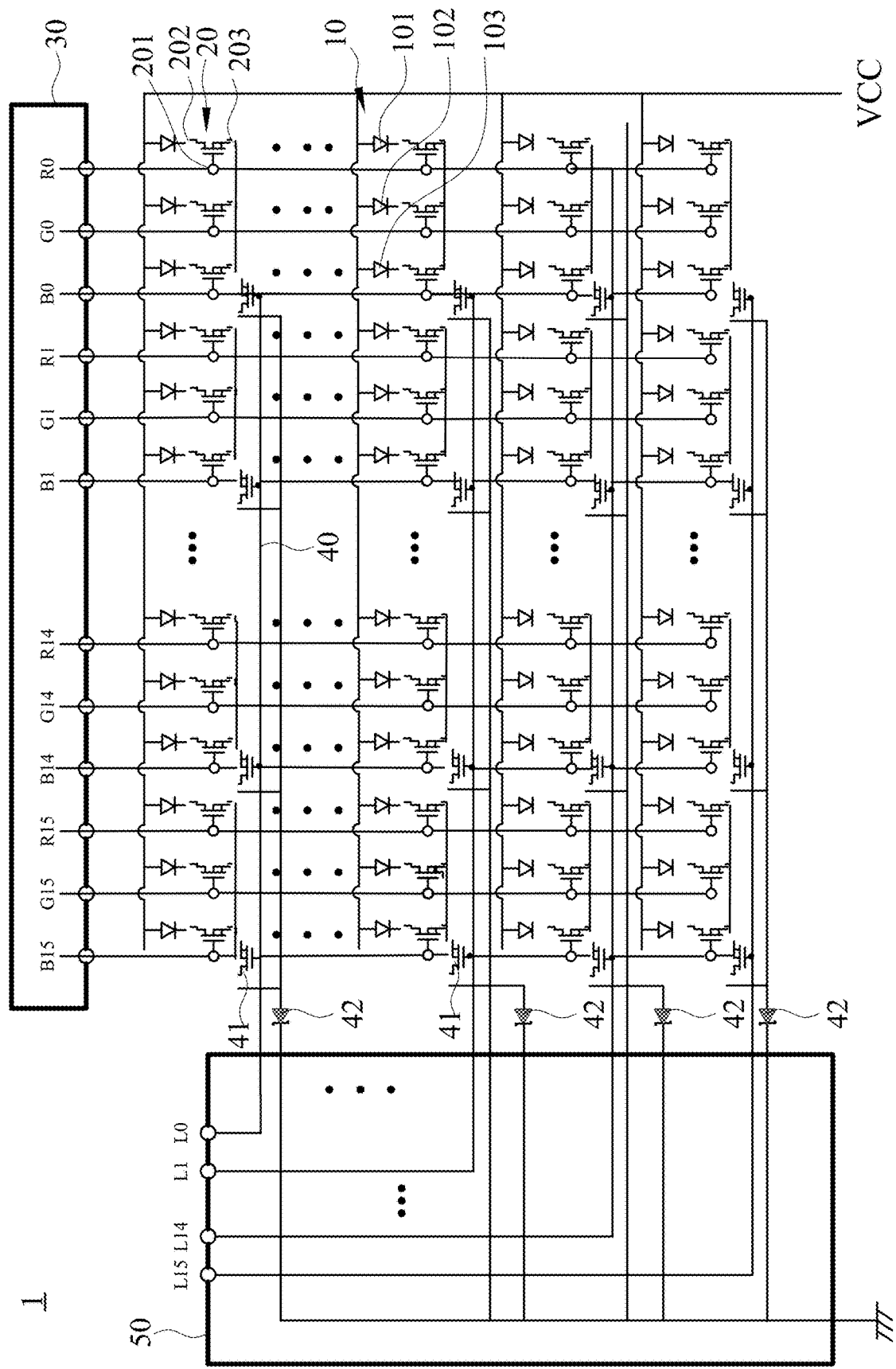
FIG. 12 is a circuit diagram of the active mini LED display according to Embodiment 7 of the present invention.

Please refer to FIG. 12, FIG. 12 is a circuit diagram of an active mini LED display according to Embodiment 7 of the present invention.

As shown in FIG. 12, the active mini LED display in the Embodiment 7 of the present invention is substantially the same as in the Embodiment 3, except that Embodiment 7 has a Schottky diode 42, the discharge of the parasitic capacitance of the light emitting diode is controlled by adding the Schottky diode 42. The improper discharge of parasitic capacitance will cause dimming, commonly known as "sparkling caused by capacitance discharged by the upper line". If the parasitic capacitance of the light-emitting diode can be released in time, theoretically, the effect of unevenness can be achieved. In traditional driving, the scanning driving signal 50 has a second metal oxide semiconductor transistor 41 whose switching speed is slower than that of the light emitting diodes, and the entire string of light emitting diodes is discharged at the same time. In the structure of the active mini LED display 1 of the present invention, each pixel 10 can be directly connected to the ground terminal 106, and the speed of the Schottky diode 42 is faster than that of the light emitting diode.

Figure 13A:
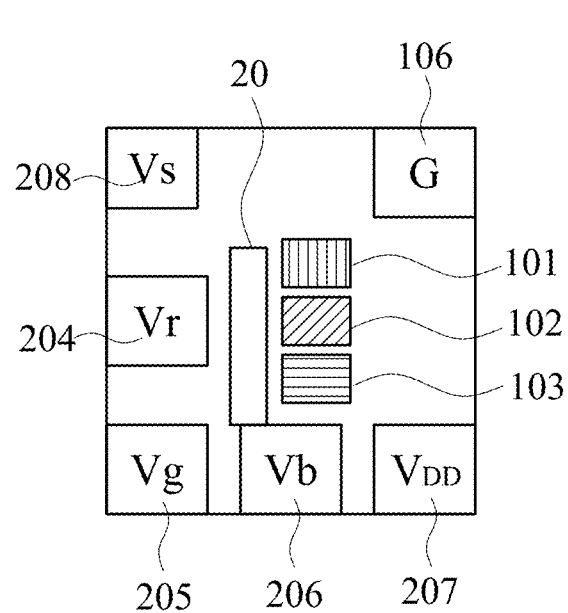
FIG. 13A is a schematic diagram of light emitting surface of pixel of the active mini LED display of the present invention.
Figure 13B:
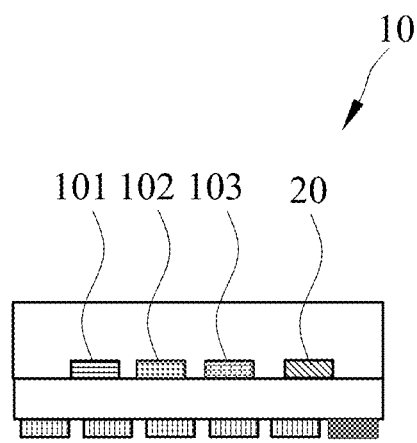
FIG. 13B is a schematic diagram of a structure of pixel of the active mini LED display of the present invention.
Figure 13C:
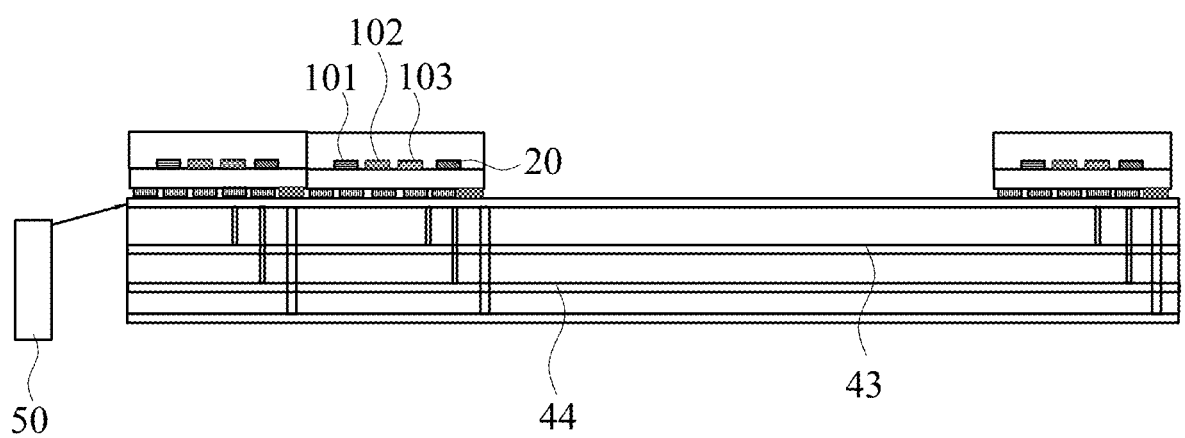
FIG. 13C is a cross section diagram of the printed circuit board of the active mini LED display of the present invention.

Please refer to FIG. 13A to FIG. 13C, FIG. 13A is a schematic diagram of light emitting surface of pixel of the active mini LED display of the present invention; FIG. 13B is a schematic diagram of a structure of the active mini LED display of the present invention; and FIG. 13C is a cross section view of the printed circuit board of the active mini LED display of the present invention.

As shown in FIG. 13A to FIG. 13C, when the scanning driving signal 50 provides with a voltage to present an open state, the required current is generated to drive the red mini light emitting diode chip 101, the green mini light emitting diode chip 102 and the blue mini light emitting diode chip 103. Therefore, the distance traveled by current from the pixel 10 to a ground layer 43 and a voltage layer 44 are short, thereby reducing the resistance and parasitic inductance of the printed circuit board wire traces. It is different from traditional displays that the current has to travel a longer distance.

Please refer to FIG. 14A to FIG. 14E, FIG. 14A is a schematic top view of the vertical structure of the metal oxide semiconductor transistor of the present invention; FIG. 14B is a schematic bottom view of the vertical structure of the metal oxide semiconductor transistor of the present invention; FIG. 14C is a cross-section view of the vertical structure of the metal oxide semiconductor transistor of the present invention; FIG. 14D is a top view of horizontal structure of the metal oxide semiconductor transistor of the present invention; and FIG. 14E is a cross-section view of the vertical structure of the metal oxide semiconductor transistor of the present invention.

As shown in FIG. 14A to FIG. 14E, the first metal oxide semiconductor transistors 20 and the second metal oxide semiconductor transistor 41 comprise a gallium nitride transistor or a silicon carbide metal oxide transistor, and the first metal oxide semiconductor transistors 20 and the second metal oxide semiconductor transistor 41 are P-type metal oxide semiconductor field effect transistors with a vertical structure. The gate 201 and the source 203 are disposed on the front side of the vertical structure, and the drain 202 is disposed on the back side of the vertical structure. As shown in FIG. 14D to FIG. 14E, the first metal oxide semiconductor transistors 20 and the second metal oxide semiconductor transistor 41 are horizontal structures, and the gate 201, the drain 202 and the source 203 are disposed on the top side of the horizontal structure.

Figure 15A:
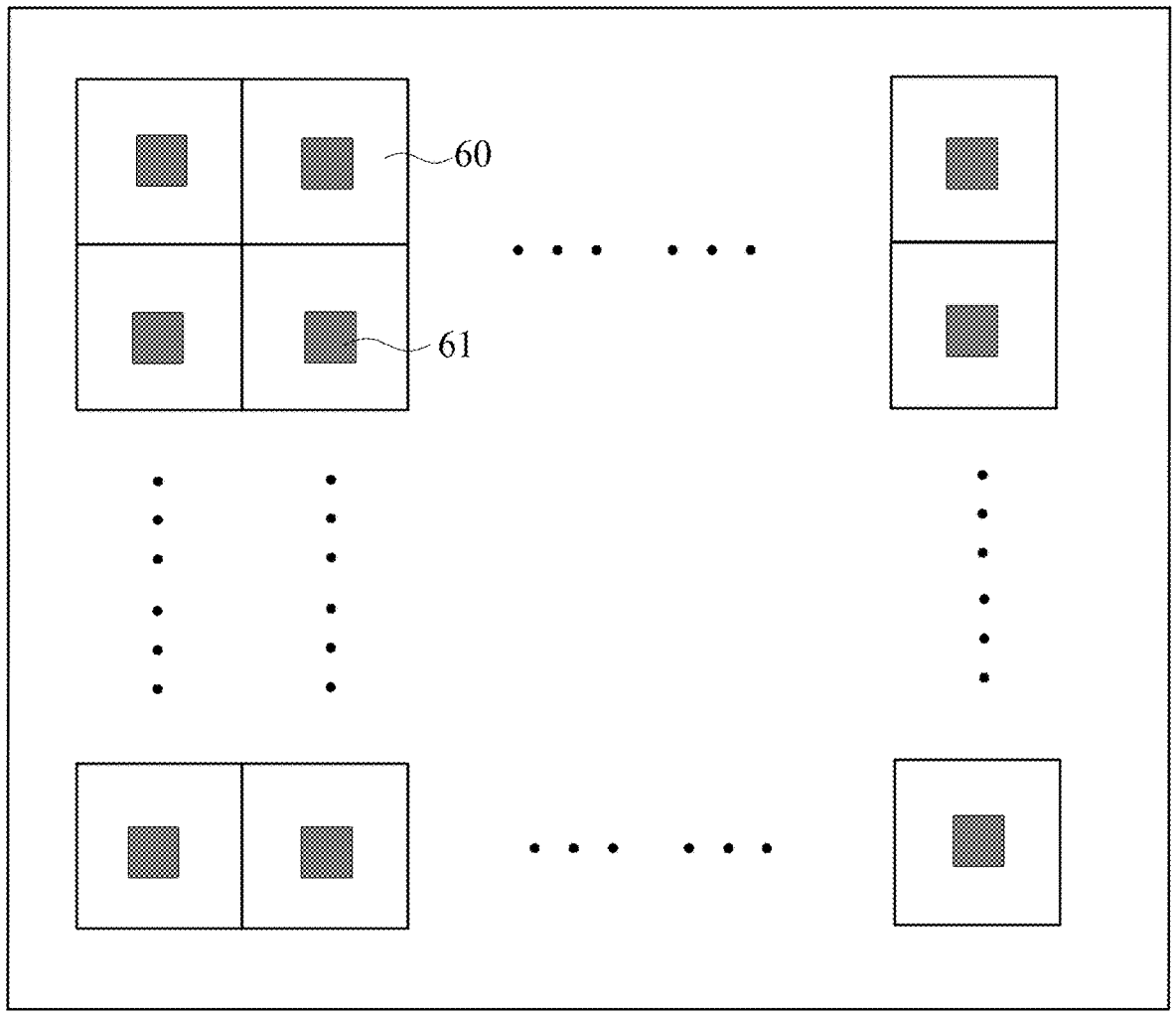
FIG. 15A is a schematic diagram of a traditional display divided into multiple small modules.
Figure 15B:
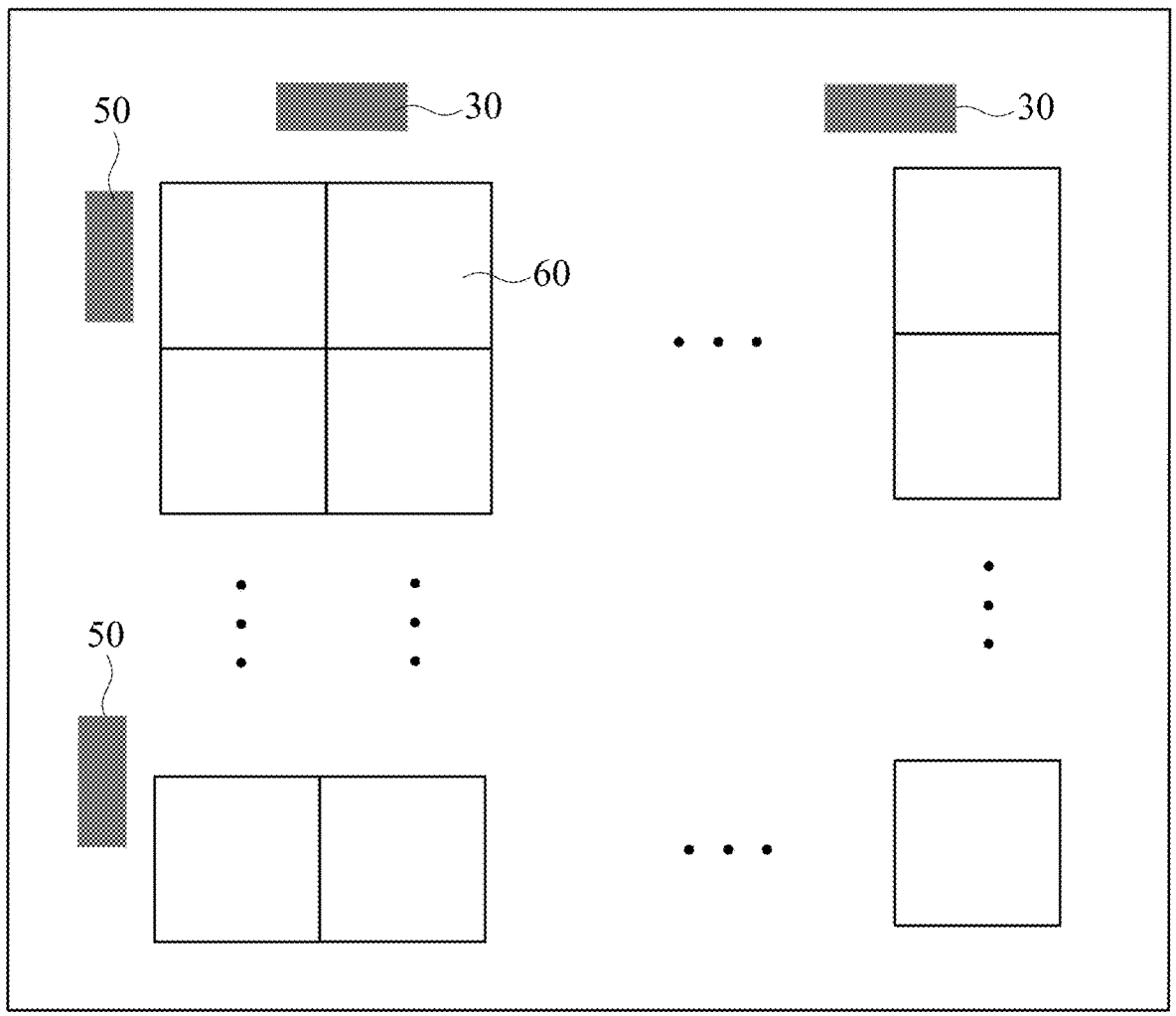
FIG. 15B is a schematic diagram of the active mini LED display of the present invention divided into multiple small modules.

Please refer to FIG. 15A to FIG. 15B, FIG. 15A is a schematic diagram of a traditional display divided into multiple small modules; and FIG. 15B is a schematic diagram of the active mini LED display of the present invention divided into multiple small modules.

As shown in FIG. 15A, FIG. 15A is a traditional display, which is divided into a plurality of small modules 60, and the driver ICs 61 are disposed on the back center of the printed circuit boards of these small modules 60. The reasons for adopting the structure are as follows. First, because the integrated channel signal circuit and scanning signal are integrated in the driver ICs 61, it is necessary that the heat dissipation problem caused by the excessive concentration of heat generated by power loss is dealt if too many control circuits are integrated. Therefore, it is not possible to integrate too many control transistors in the chip. Secondly, because the distance from the driving circuit to the light emitting diode to be driven should be shortened as much as possible to reduce the heat generated by the energy loss caused by the resistance of the driving current through the wire, the display is divided into the small modules 60, and dispose the driver ICs 61 in the central area of these small modules 60. As shown in FIG. 15A, the entire display is formed by the matrix arrangement of the small modules 60; therefore, the complexity of the arrangement of the entire display channel and scanning transmission line are increased. As shown in FIG. 15B the structure of the active mini LED display of the present invention is to disperse a part of the control transistors into each pixel, the driving signal is driven by voltage and the distance between the power supply and the grounding line is minimized. Therefore, the structure shown in FIG. 15B can be adopted, and the driving circuit of the channel signal (such as the channel driving signal in FIG. 15B) and the driving chip of the scanning signal (such as the scanning driving signal 50 in FIG. 15B) are separately arranged on the edge of the display, which can improve the heat dissipation effect, reduce the complexity of wiring and improve the quality and reliability of the display.

The foregoing description, for the purpose of explanation, has been described with reference to specific embodiments. However, the embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

We claim:

1. A driving method for an active mini light-emitting diode (LED) display, comprising:
    disposing array pixels and a plurality of first metal oxide semiconductor transistors on a substrate, each pixel having at least one red mini light emitting diode chip, at least one green mini light emitting diode chip, and at least one blue mini light emitting diode chip, and disposing the pixels at equal intervals; wherein at least one red mini light emitting diode chip, at least one green mini light emitting diode chip and at least one blue mini light emitting diode chip are respectively disposed correspondingly to one of the first metal oxide semiconductor transistors;
    connecting a gate of the first metal oxide semiconductor transistors to a channel driving signal;
    connecting one end of each pixel together by a connection line and connecting to a scanning driving signal through a second metal oxide semiconductor transistor; connecting another end of each pixel to the sources of the first metal oxide semiconductor transistors; and connecting the scanning driving signal to light up at least one red mini light emitting diode chip, at least one green mini light emitting diode chip and at least one blue mini light emitting diode chip of each pixel and control brightness;
    applying a set voltage through the channel driving signal to control the currents passing through at least one red mini light emitting diode chip, at least one green mini light emitting diode chip and at least one blue mini light emitting diode chip to adjust respectively brightness thereof; and
    correcting a forward voltage drop information of each pixel by an arithmetic unit to calculate a correction value of the voltage offset; correcting the difference in color and/or brightness of each pixel according to the correction value; and storing the forward voltage drop information and the information of the difference of color and/or brightness of each pixel in a flash read-only memory and/or other type of memory devices, and further calculating a signal corresponding to the channel driving signal such that chromatic aberration of each pixel is compensated and corrected by voltages of the first metal oxide semiconductor transistors connected at least one red mini light emitting diode chip, the at least one green mini light emitting diode chip, and the at least one blue mini light emitting diode chip of the pixel;
    wherein the scanning driving signal use an analog-type signal and/or PWM (pulse width modulation) signal to modulation the color and/or the brightness of each pixel, and controls to turn on and turn off each pixel in the horizontal direction in the period of the scanning time.

2. The driving method for an active mini LED display according to claim 1, further comprising: controlling sequentially to turn on and turn off the channel driving signal and the scanning driving signal by a clock signal, a horizontal synchronic signal, a vertical synchronic signal and an RGB signal obtained from an image signal of each pixel, and a data enable signal of generating module image display through a clock controller.

3. The driving method for an active mini LED display according to claim 1, further comprising: calculating the signal corresponding to the channel driving signal through a digital-to-analog converter; and compensating and correcting the chromatic aberration of each pixel through the voltages of the first metal oxide semiconductor transistors connected to the red mini light emitting diode chip, the green mini light emitting diode chip and the blue mini light emitting diode chip.

4. An active mini LED display, used for a method according to claim 1, the active mini light emitting diode display connected to a scanning driving signal and a channel driving signal, the active mini light emitting diode including a plurality of package modules arranged in an array, every package module comprising:
    a substrate;
    a plurality of pixels disposed on the substrate, each pixel having at least one red mini light emitting diode chip, at least one green mini light emitting diode chip, and at least one blue mini light emitting diode chip, and disposing the pixels at equal intervals;
    a plurality of first metal oxide semiconductor transistors respectively disposed to at least one red mini light emitting diode chip, at least one green mini light emitting diode chip and at least one blue mini light emitting diode chip, and the first metal oxide semiconductor transistors respectively having a source connected to the scanning driving signal, a gate connected to the channel driving signal and a drain; and
    a plurality of connection lines, one end of each pixel connected together by each connection line and connected to the scanning driving signal through a second metal oxide semiconductor transistor;
    wherein the first metal oxide semiconductor transistors and the second metal oxide semiconductor transistors comprise a gallium nitride transistor or a silicon carbide metal oxide transistor, and the first metal oxide semiconductor transistors and the second metal oxide semiconductor transistor are a vertical structure or a horizontal structure.

5. The active mini LED display according to claim 4, further comprising a Schottky diode connected to each pixel or the scanning driving signal.

6. The active mini LED display according to claim 4, wherein the electrode of at least one red mini light emitting diode chip, the electrode of at least one green mini light emitting diode chip and the electrode of at least one blue mini light emitting diode chip are all in a horizontal structure; or the electrode of at least red mini light emitting diode chip, the electrode of at least green mini light emitting diode chip and the electrode of at least one blue mini light emitting diode chip are all in a vertical structure.

7. The active mini LED display according to claim 4, wherein at least one red mini light emitting diode chip is the vertical structure, at least one green mini light emitting diode chip and at least one blue mini light emitting diode chip are both horizontal structure.

8. The active mini LED display according to claim 4, further comprising an arithmetic unit composed of the flash read-only memory, an adder and a multiplier; wherein a forward voltage drop information of each pixel is corrected by the arithmetic unit to calculate a correction value of the voltage offset, and the difference in color or brightness of each pixel is corrected according to the correction value, and the forward voltage drop information and the information of the difference of color or brightness of each pixel are stored in a flash read-only memory.

9. The active mini LED display according to claim 4, wherein the driver circuit for the channel signal and the driver chip for the scanning signal are separately arranged on an edge of the active mini LED display.

\* \* \* \* \*